United States Patent [19]
Krolik

[11] B 3,987,477
[45] Oct. 19, 1976

[54] BETA COMPENSATED INTEGRATED CURRENT MIRROR

[75] Inventor: Kenneth J. Krolik, San Jose, Calif.

[73] Assignee: Motorola, Inc., Schaumburg, Ill.

[22] Filed: Sept. 25, 1974

[21] Appl. No.: 508,961

[44] Published under the second Trial Voluntary Protest Program on February 3, 1976 as document No. B 508,961.

[52] U.S. Cl. .............................. 357/36; 307/299 B; 357/35; 357/86
[51] Int. Cl.² .................. H01L 29/06; H01L 29/72
[58] Field of Search ............. 357/35, 36; 307/299 B

[56] References Cited
UNITED STATES PATENTS

| | | | |
|---|---|---|---|
| 3,579,059 | 5/1971 | Widlar | 357/35 |
| 3,633,052 | 1/1972 | Hanna | 357/35 |
| 3,694,762 | 9/1972 | Mulder | 307/299 B |
| 3,700,921 | 10/1972 | Gay | 307/299 B |
| 3,761,787 | 9/1973 | Davis et al. | 357/35 |
| 3,809,929 | 5/1974 | Vittoz | 357/36 |
| 3,820,007 | 6/1974 | Schilling et al. | 357/35 |
| 3,822,387 | 7/1974 | Mulder | 357/36 |
| 3,879,745 | 4/1975 | Tharmaratnam | 357/35 |

Primary Examiner—William D. Larkins
Attorney, Agent, or Firm—James W. Gillman; Eugene A. Parsons; Sang Ki Lee

[57] ABSTRACT

A split collector lateral transistor wherein the amount of the emitter encircled by each of the collectors is unequal so that a greater current flows in one of the collectors and the base current plus the current flowing in the other collector is approximately equal to the greater current flowing in the one collector.

1 Claim, 1 Drawing Figure

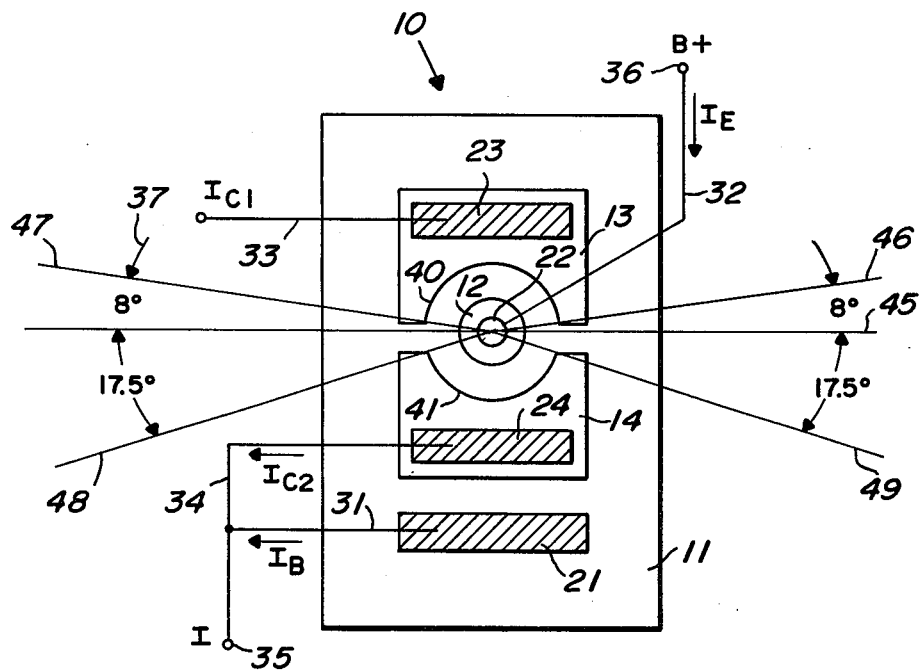

BETA COMPENSATED INTEGRATED CURRENT MIRROR

BACKGROUND OF THE INVENTION

In linear circuit design wherein current mirrors of the split collector lateral transistor type are utilized, a first collector is connected into the circuit directly while a second collector is connected to the base. The designer usually wants the current in the first collector to identically follow the combined current flowing in the second collector and the base. In a high beta transistor, where base current is insignificant, the currents of the first and second collectors are very close and the designer can ignore the base current. However, in reality the beta of split collector lateral transistors is very low, typically approximately 15, and this low beta produces serious errors in the circuitry.

SUMMARY OF THE INVENTION

The present invention is a beta compensated integrated current mirror wherein the amount of emitter encircled by each of two collectors in a split collector lateral transistor differs so that the current flowing in the first collector is equal to the sum of the currents flowing in the second collector and the base.

It is an object of the present invention to provide a beta compensated integrated current mirror.

It is a further object of the present invention to provide a split collector lateral transistor wherein the amount of current flowing in one collector differs from the amount of current flowing in the other collector.

These and other objects of this invention will become apparent to those skilled in the art upon consideration of the accompanying specification, claims and drawing.

BRIEF DESCRIPTION OF THE DRAWING

The single FIGURE is a view in top plan of a split collector lateral transistor connected in a current mirror configuration.

DESCRIPTION OF THE PREFERRED EMBODIMENT

Referring specifically to the FIGURE, the numeral 10 generally designates a split collector lateral transistor having a chip of semiconductor material 11 which serves as the base of the transistor. A generally circular emitter 12 is formed in approximately the center of one major surface of the chip 11. The emitter 12 may be formed by some convenient means, such as defusion or the like, well known to those skilled in the art. First and second collector portions 13 and 14, respectively, are formed in the same major surface of the base 11 in spaced relation from each other and the emitter 12. In the present embodiment, the emitter 12 is circular (although other configurations might be devised by those skilled in the art) and the edges of the collector portions 13 and 14, which are adjacent to the emitter 12, are formed arcuately around the emitter 12 and concentric therewith.

Electrical connectors 21, 22, 23 and 24 are electrically and mechanically attached to the base 11, emitter 12, first collector portion 13 and second collector portion 14, respectively. In the present embodiment the chip 11 is N doped semiconductor material and the emitter 12, first collector portion 13 and second collector portion 14 are P type materials diffused into the base chip 11 to form a split collector lateral transistor.

A wire 31 is electrically attached to the connector 21 and carries base current, $I_B$, to an output terminal 35. A wire 32 is electrically attached to the connector 22 and is connected to a terminal 36, adapted to have B+ supplied thereto. The wire 32 carries emitter current, $I_E$, to the emitter 12. A wire 33 is electrically attached to the connector 23 and carries the first collector current, $I_{C1}$, to an output terminal 37. Another wire 34 is electrically attached to the connector 24 and carries the second collector current, $I_{C2}$, to the output terminal 35.

In linear circuit design, the designer usually wants the current $I_{C1}$ to identically follow the current $I$, which is the current $I_{C2} + I_B$. Therefore, $$I_B = \frac{I_{C2} + I_{C1}}{B}$$

$$I = I_{C1} I_{C2} + I_B = I_{C1} I_{C2} + I_{C2} + I_{C1}/B = I_{C1} I_{C2} + I_{C2}/B$$
$$= I_{C1} - I_{C1}/B$$

When $B = 15$ $$16/15 \ I_{C2} = 14/15 \ I_{C1} \quad I_{C2}/I_{C1} = 0.875$$

It can be seen that for a low beta transistor, such as the PNP type transistor illustrated in this embodiment, which has a beta of approximately 15, that there is a substantial error in the initial formula, $I = I_{C1}$ if the two collector portions 13 and 14 each have the same amount of current flowing therein. Since all prior art split collector transistors are constructed so that the collectors carry equal currents, it is necessary to provide external compensation for low beta transistors to correct this error.

In the present embodiment the first collector portion 13 is constructed with an inner arcuate edge 40 which is concentric with the emitter 12. The second collector portion 14 has an inner arcuate edge 41 which is also concentric with the emitter 12. The arcuate edges 40 and 41 of the collector portions 13 and 14 substantially encircle the emitter 12, except for the spacing between the collector portions 13 and 14 at either end of the arcuate edges 40 and 41. Equal amounts of current flow outwardly in all directions from the emitter 12 and, therefore, the amount of the emitter 12 encircled by the arcuate inner edge 40 of the collector 13 and the arcuate inner edge 41 of the collector 14 determines the amount of current flowing in the collector 13 and the collector 14, respectively. By extending a diameter 45 of the emitter 12 outwardly in both directions so as to be equidistant from both ends of the arcuate inner edge 40 and equidistant from both ends of the arcuate inner edge 41, and by extending radii 46–49 of the emitter 12 through each of the ends of the arcuate inner edges 40 and 41, it can be seen that the transistor 10 is constructed so that the radii 46 and 47 extending through the ends of the inner arcuate edge 40 form an angle of 8° with the diameter 45 and the radii 48 and 49 extending through the ends of the inner arcuate edge 41 form an angle of 17.5° with the diameter 45. Thus, the inner arcuate edge 40 of the first collector portion 13 extends for an angle of 164° around the emitter 12 and the inner arcuate edge 41 of the second collector portion 14 extends for an angle of 145° around the emitter 12. Therefore, the ratio of the amount of emitter 12 encircled by the collector 13 to the amount encircled by the collector 14 is equal to approximately 0.88. Since the collector 14 receives less current from the emitter 12 than the collector 13, by this ratio, the current $I_{C1}$ is approximately equal to the current $I$ and no external compensating circuits or components are required. While a PNP type transistor with a beta of 15 and a circular emitter is illustrated and described, it should be understood that many other embodiments may be devised by those skilled in the art and all such embodiments are intended to come within the scope of this invention. I desire it to be understood, therefore, that this invention is not limited to the particular form shown and I intend in the appended claims to cover all modifications which do not depart from the spirit and scope of this invention.

I claim:
1. A lateral PNP type transistor having a beta of approximately 15 forming a beta compensated integrated current mirror comprising:
   a. a base composed of semiconductor material;
   b. an emitter formed on said base and in connection therewith;
   c. first and second collector portions formed on said base in spaced relation from said emitter and each other and in partially encircling relationship to said emitter, said first and second collector portions each defining an inner edge adjacent said emitter with the inner edge of said first collector portion encircling approximately 163° of the emitter and the inner edge of said second collector portion encircling approximately 145° of the emitter, the amount of current from said emitter flowing in each of said collector portions being dependent upon the amount of said emitter encircled by the inner edges of each of said collector portions;
   d. said base and said second collector portion being electrically connected so that the current flowing in said base and in said second collector portion forms a single current; and
   e. the amount of said emitter encircled by each of the inner edges of said first and second collector portions being formed so that the current flowing in said first collector portion is approximately equal to the single current.

\* \* \* \* \*